United States Patent [19]
Myers

[11] Patent Number: 5,554,955
[45] Date of Patent: Sep. 10, 1996

[54] METHOD AND APPARATUS FOR REMOVING THE EFFECTS OF CO-CHANNEL INTERFERENCE FROM THE MESSAGE ON A DOMINANT FREQUENCY MODULATED CARRIER AND FOR RECOVERING THE MESSAGE FROM EACH OF TWO CO-CHANNEL CARRIERS

[76] Inventor: Glen A. Myers, 279 Laureles Grade Rd., Salinas, Calif. 93908

[21] Appl. No.: 519,696

[22] Filed: Aug. 28, 1995

[51] Int. Cl.$^6$ .................................................. H03D 3/00
[52] U.S. Cl. ........................ 329/317; 329/318; 329/327; 329/341; 329/345; 455/206; 455/337
[58] Field of Search .................................. 329/300–310, 329/315–318, 323, 327, 341–343, 345, 346; 375/324, 328; 455/205, 206, 214, 337

[56] References Cited

U.S. PATENT DOCUMENTS

| | | | |
|---|---|---|---|
| 2,310,749 | 2/1943 | Ressler | 455/206 |
| 4,163,945 | 8/1979 | Ishigaki et al. | 455/205 |
| 4,166,251 | 8/1979 | Ishigaki et al. | 455/205 X |
| 4,249,261 | 2/1981 | Ogita | 455/206 X |
| 4,525,868 | 6/1985 | Kage et al. | 455/206 |
| 4,590,615 | 5/1986 | Ohtaki et al. | 455/206 X |
| 4,726,073 | 2/1988 | Sessink | 455/205 |
| 4,859,958 | 8/1989 | Myers | 329/112 |
| 4,992,747 | 2/1991 | Myers | 329/316 |
| 5,038,115 | 8/1991 | Myers et al. | 331/2 |
| 5,329,242 | 7/1994 | Myers | 329/300 |
| 5,341,106 | 8/1994 | Pettigrew | 329/319 |

OTHER PUBLICATIONS

"A Comparison of the Effectiveness of FM Radio Interference Cancellers" by M. A. Bykhovskiy, 1984, *Scripta Publishing Co.* pp. 41–45. ISSN0040–2508/84/0003–0041.

"Adaptive Co–Channel Interference Cancelation and Signal Separation Mehtod" by Yeheskel Bar Neess and H. Bunin 1989, *IEEE*, pp. 825–830. CH2655–9/89/0000–0825.

*Primary Examiner*—David Mis

[57] ABSTRACT

Method and apparatus for improving an estimate of a message being carried by a frequency modulated dominant carrier in the presence of co-channel interference from a subdominant carrier. An envelope detector provides an envelope signal E(t). A frequency demodulator provides a demodulated frequency signal F(t). In one embodiment, a comparator compares the envelope signal to a threshold voltage $V_T$. A switch is operated when the envelope signal is less than $V_T$. The signal F applied to the switch is held by a holding circuit while the switch is open. Interpolation and lowpass filtering improve the quality of the output signal. In another embodiment of the invention, the frequency demodulated signal F is summed with an unfiltered signal to provide a first summed signal. The first summed signal is summed with an unfiltered signal to provide a second summed signal which is an estimate of the message on a co-channel subdominant carrier. Summing the filtered message on the subdominant carrier with a filtered message on the dominant carrier provides an estimate of the message on the dominant carrier. In this manner, neither recovered message experiences crosstalk. In another embodiment, digital signal processing means and apparatus are used to sample E and F. In this manner an estimate of the message on the dominant carrier which is free of the effects of interference is obtained. In addition, the messages on each of two co-channel carriers can be recovered from appropriate samples of F.

26 Claims, 12 Drawing Sheets

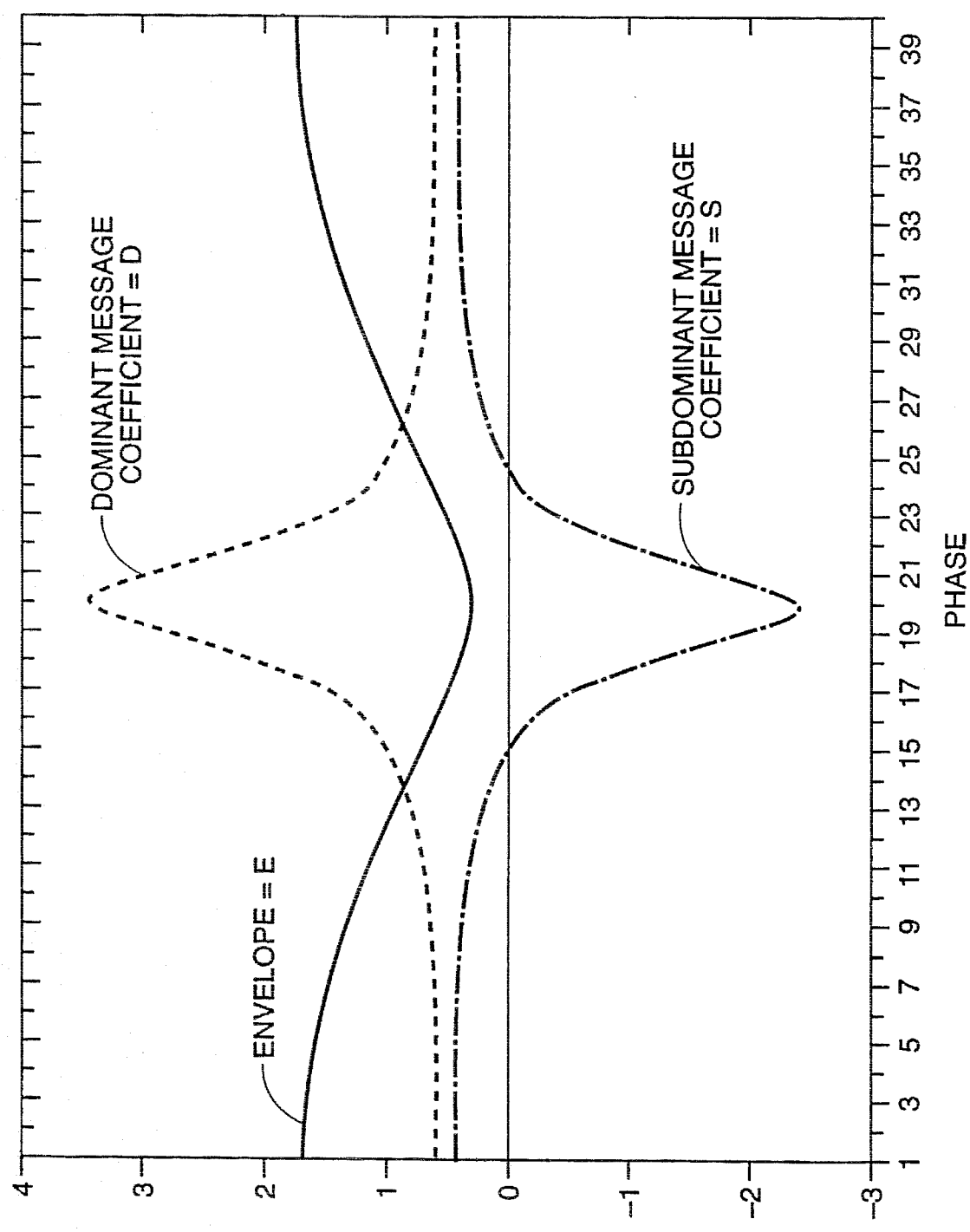
FIG._1

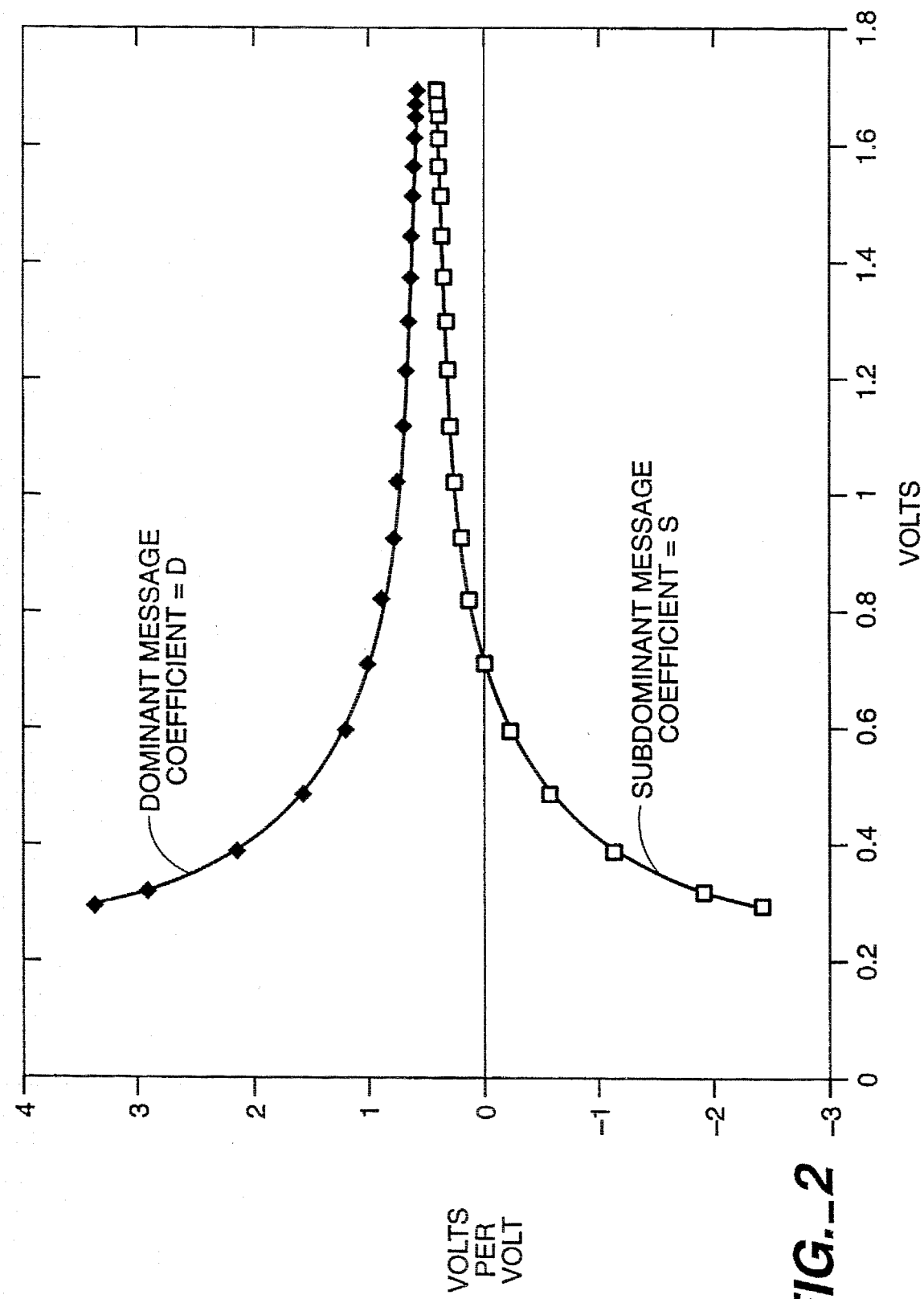
FIG._2

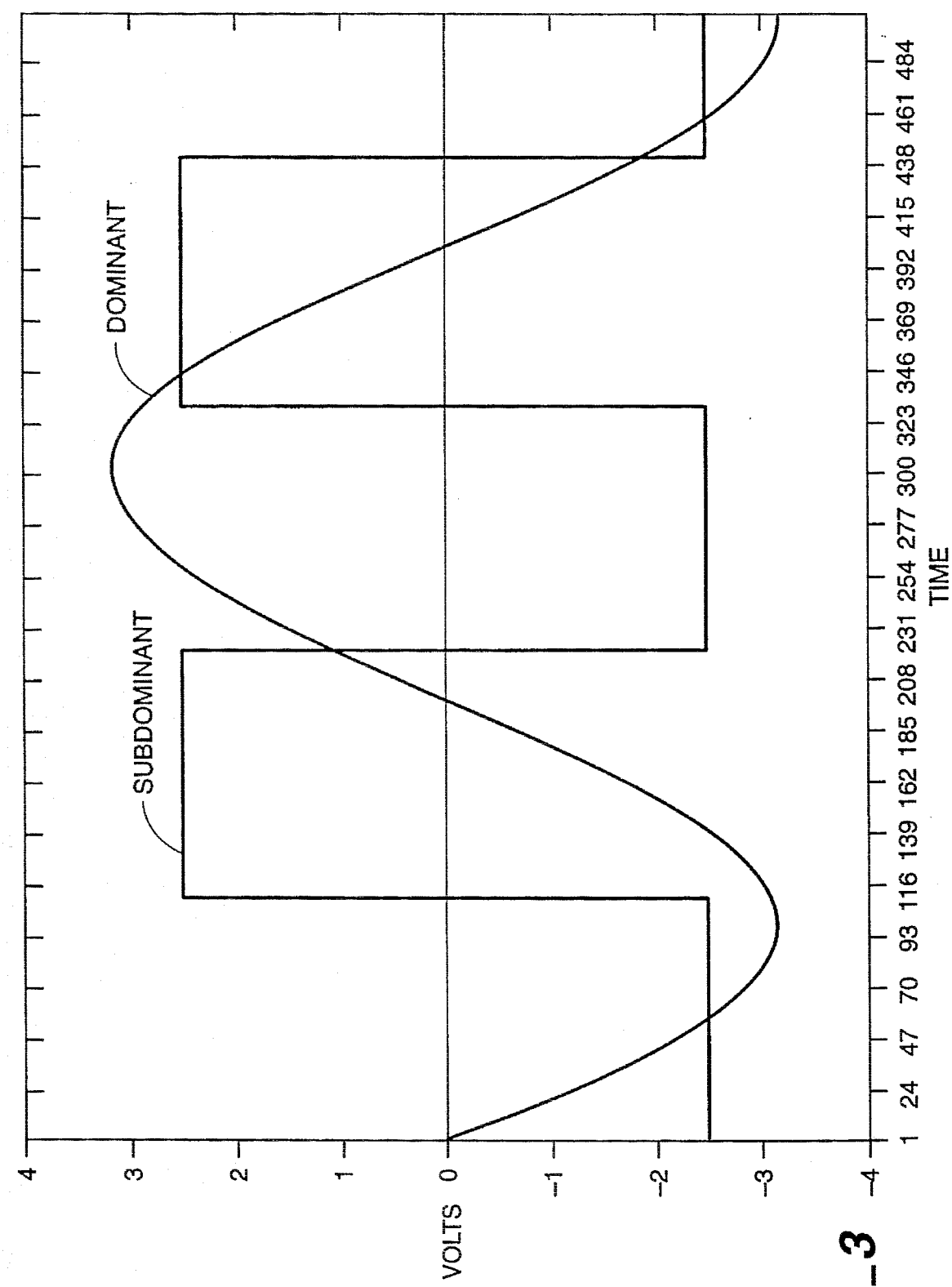
FIG._3

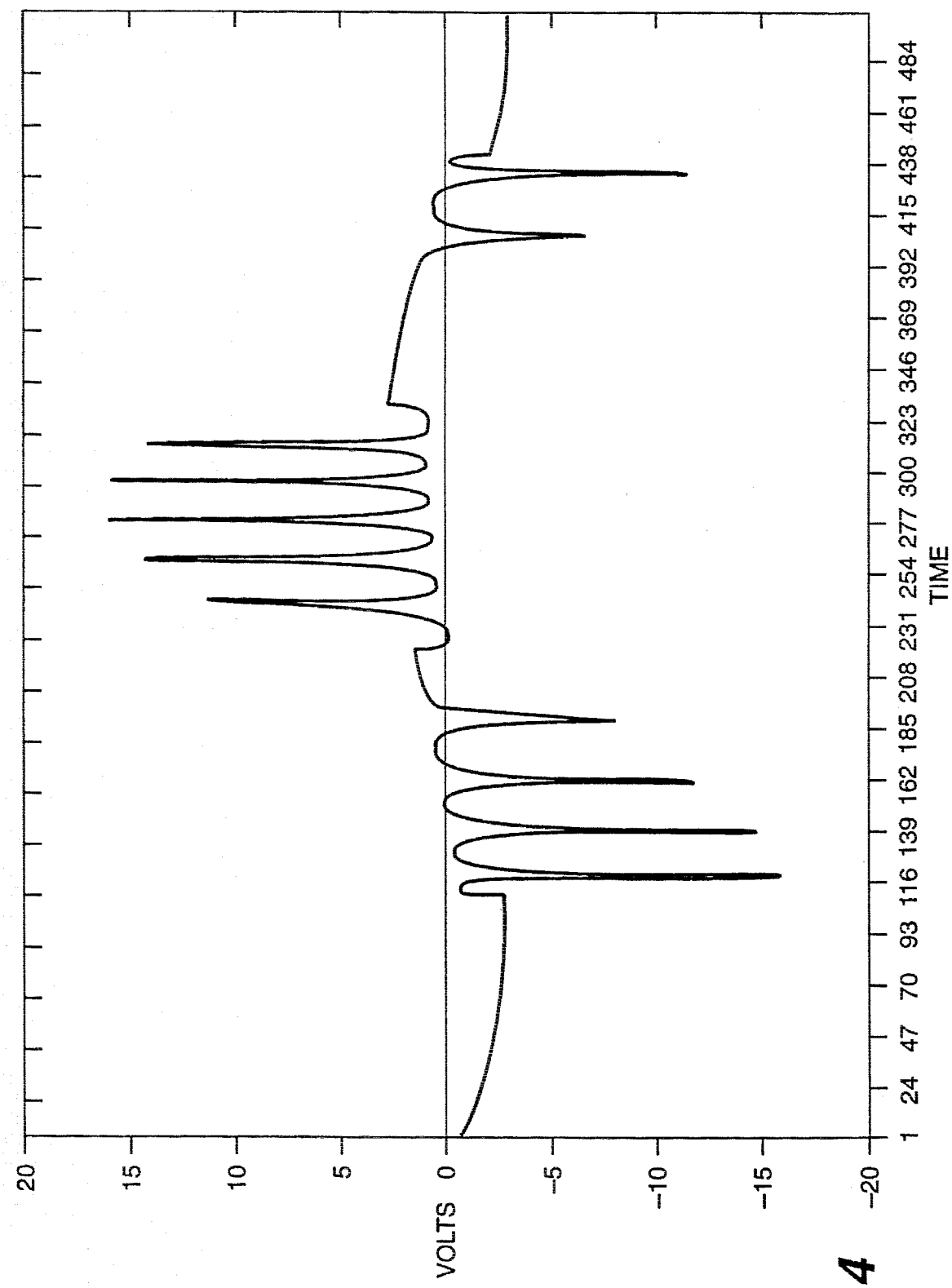
FIG._4

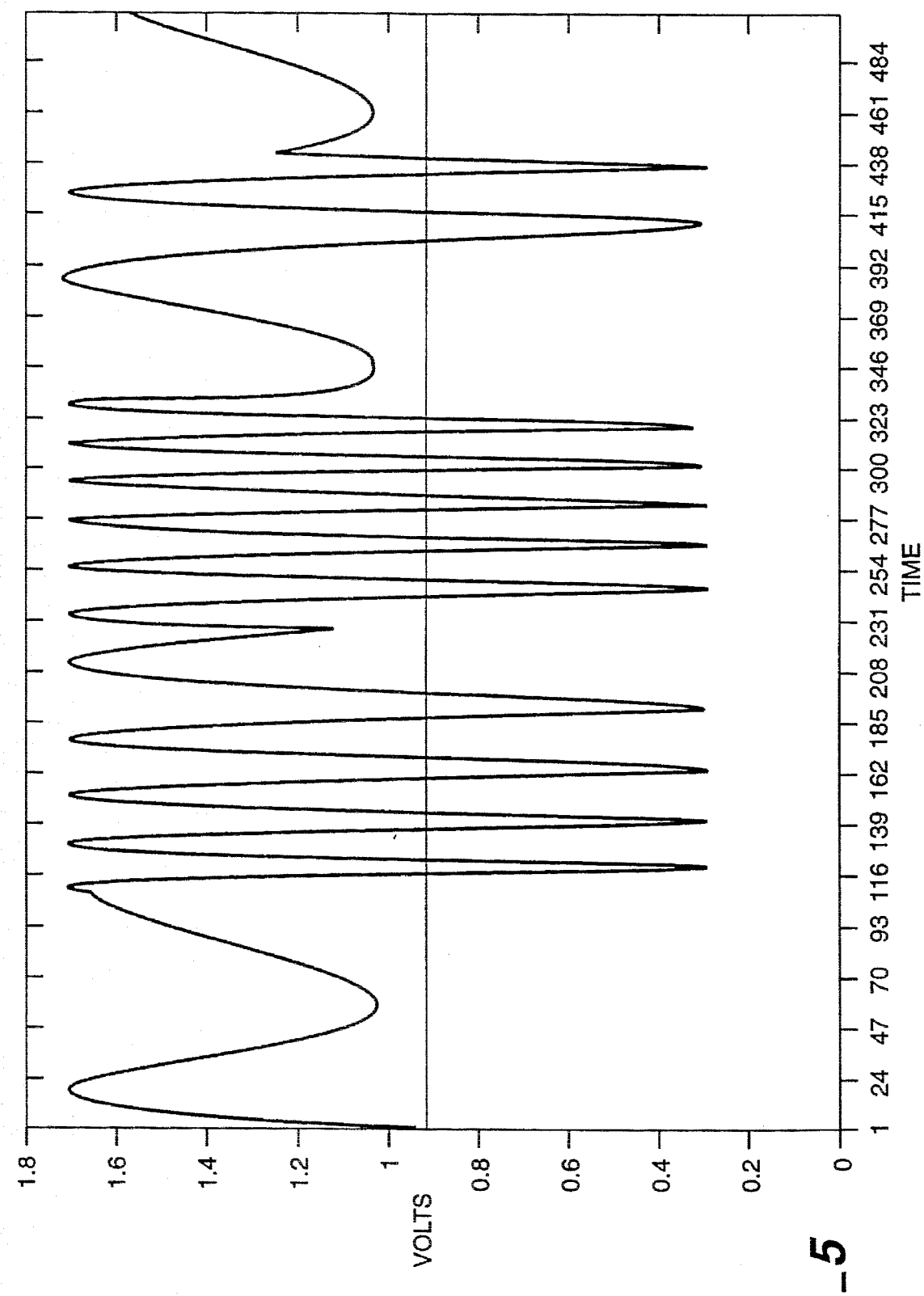
FIG._5

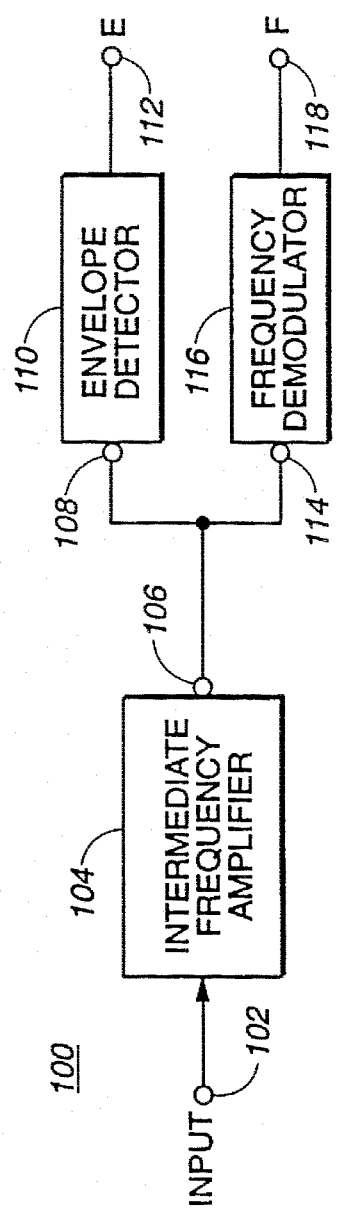
FIG._6
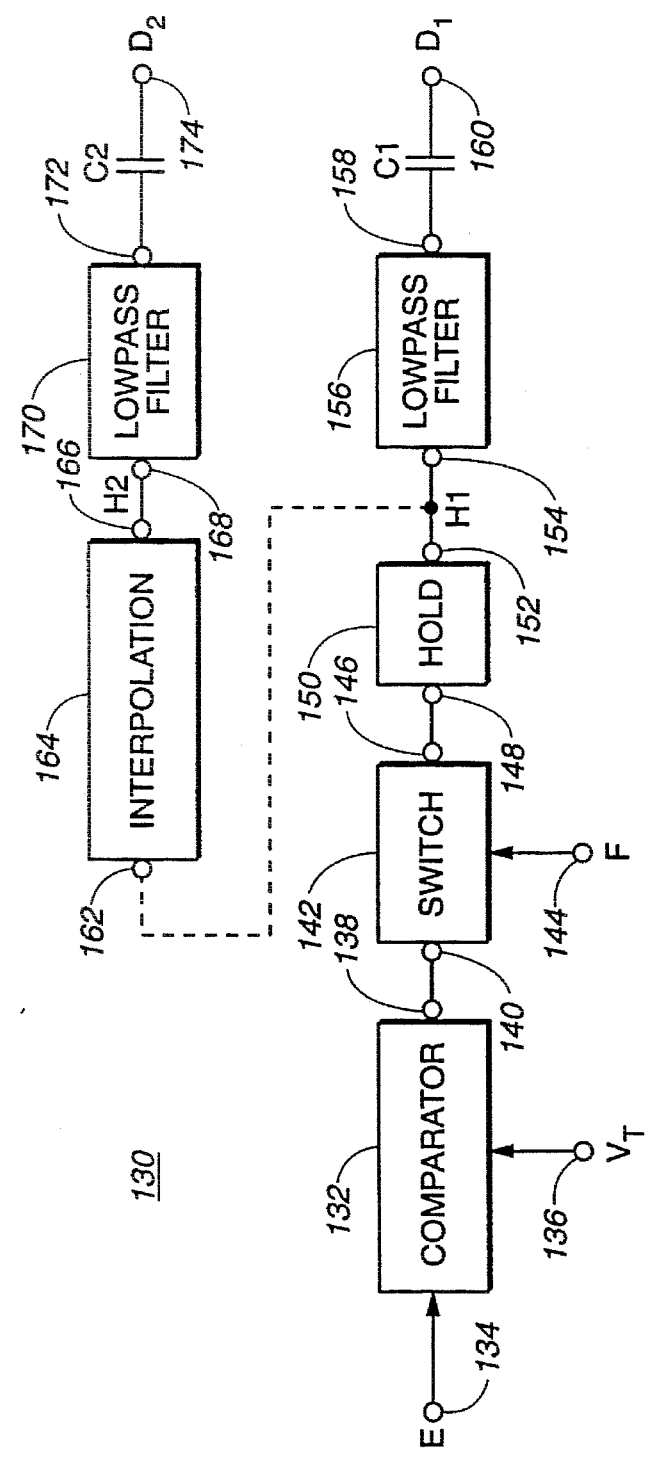
FIG._7

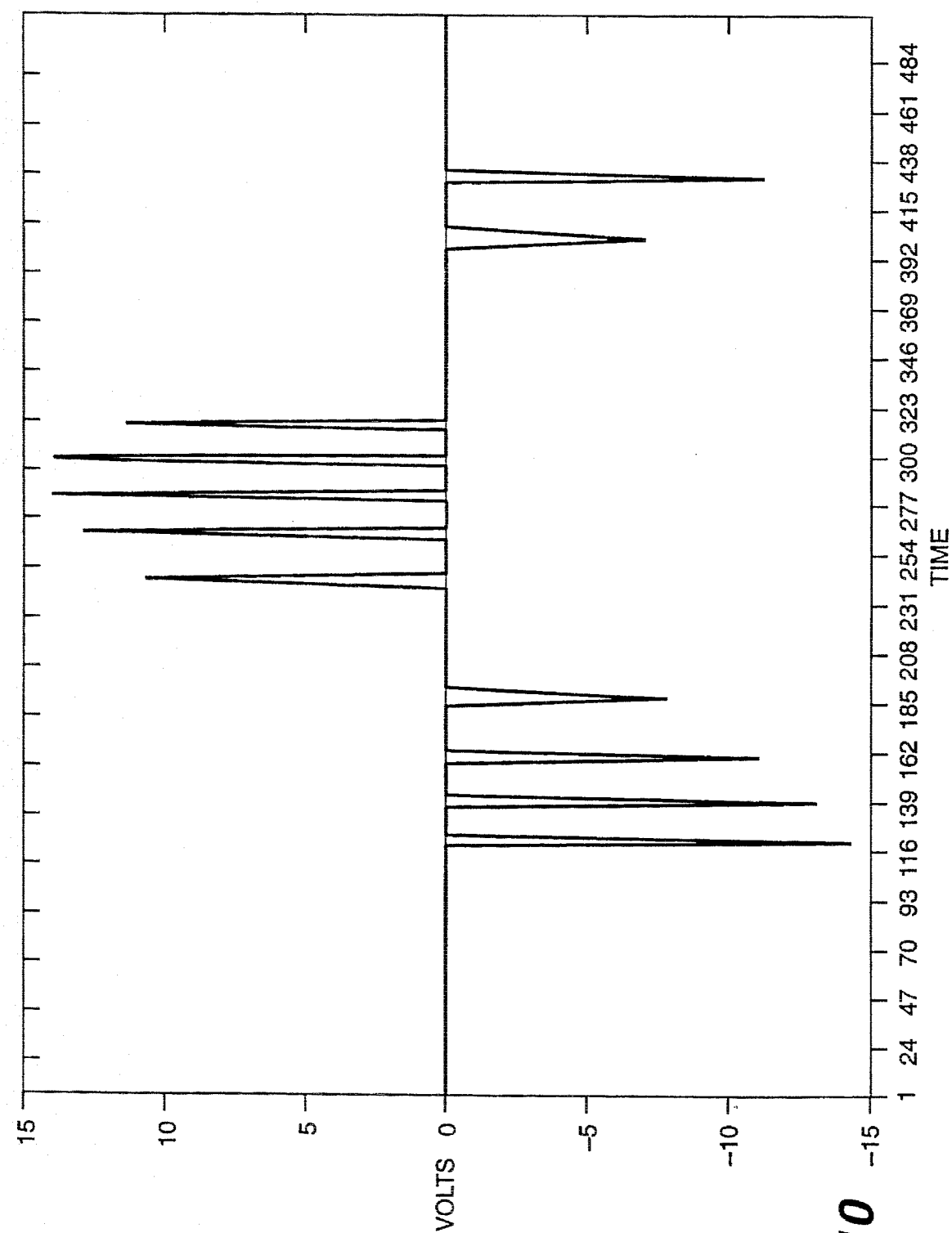
FIG._10

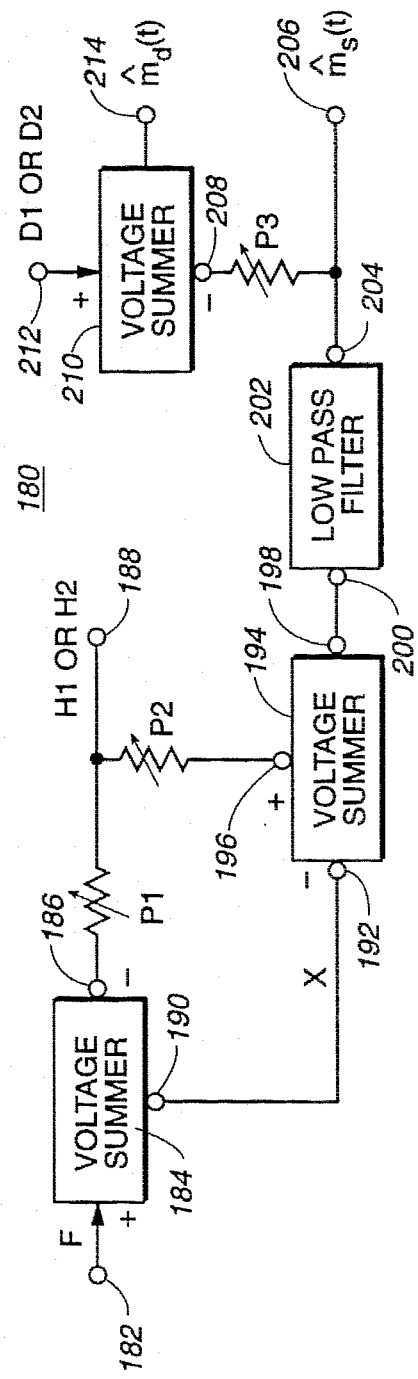
FIG._11
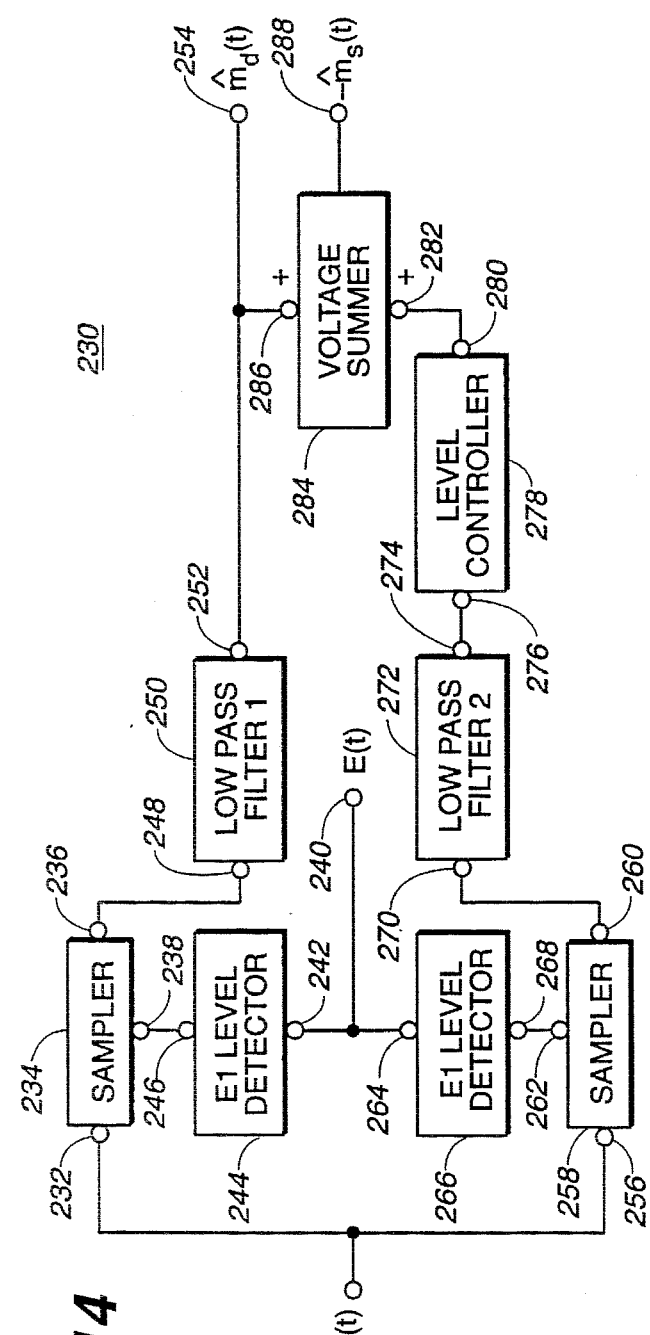
FIG._14

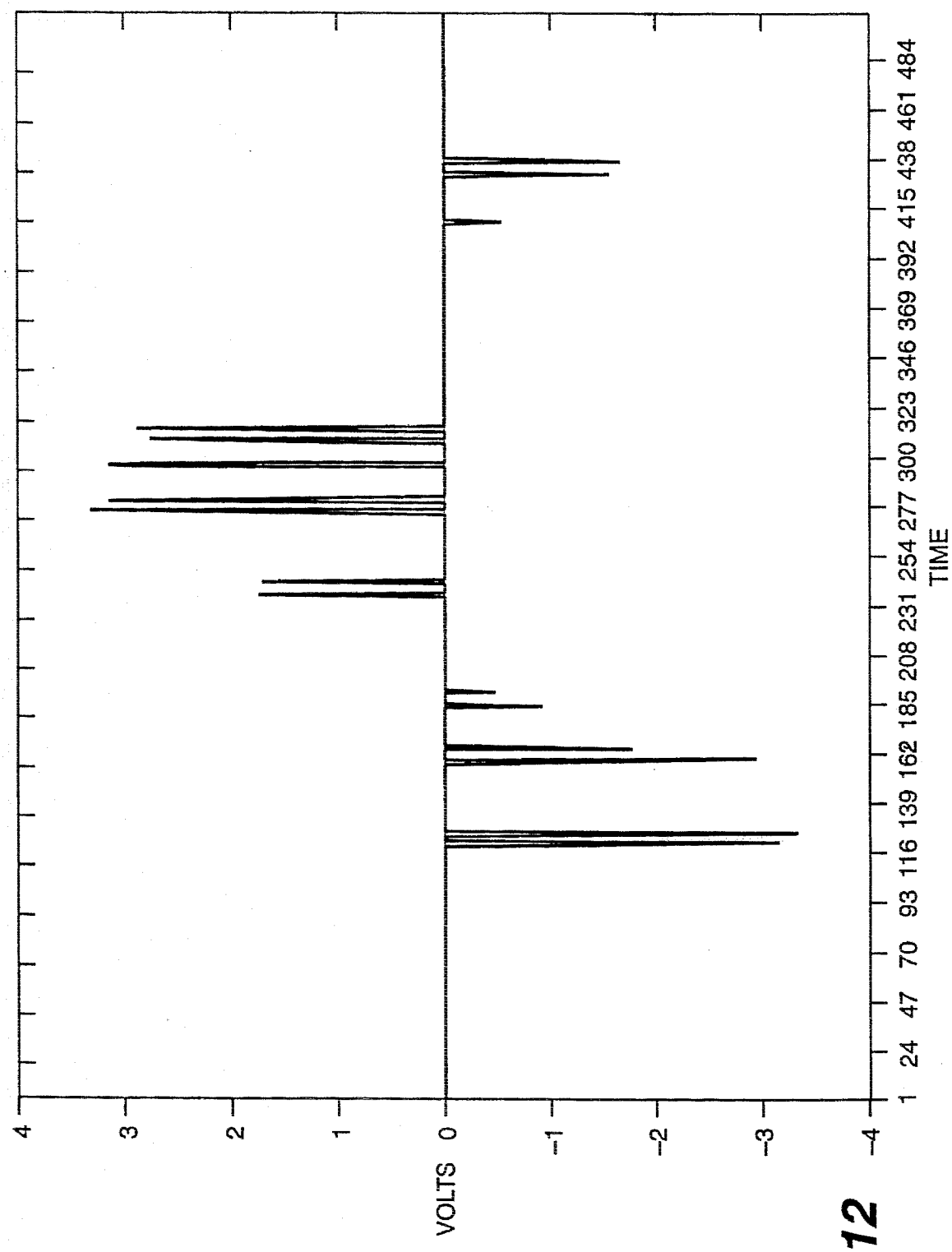
FIG._12

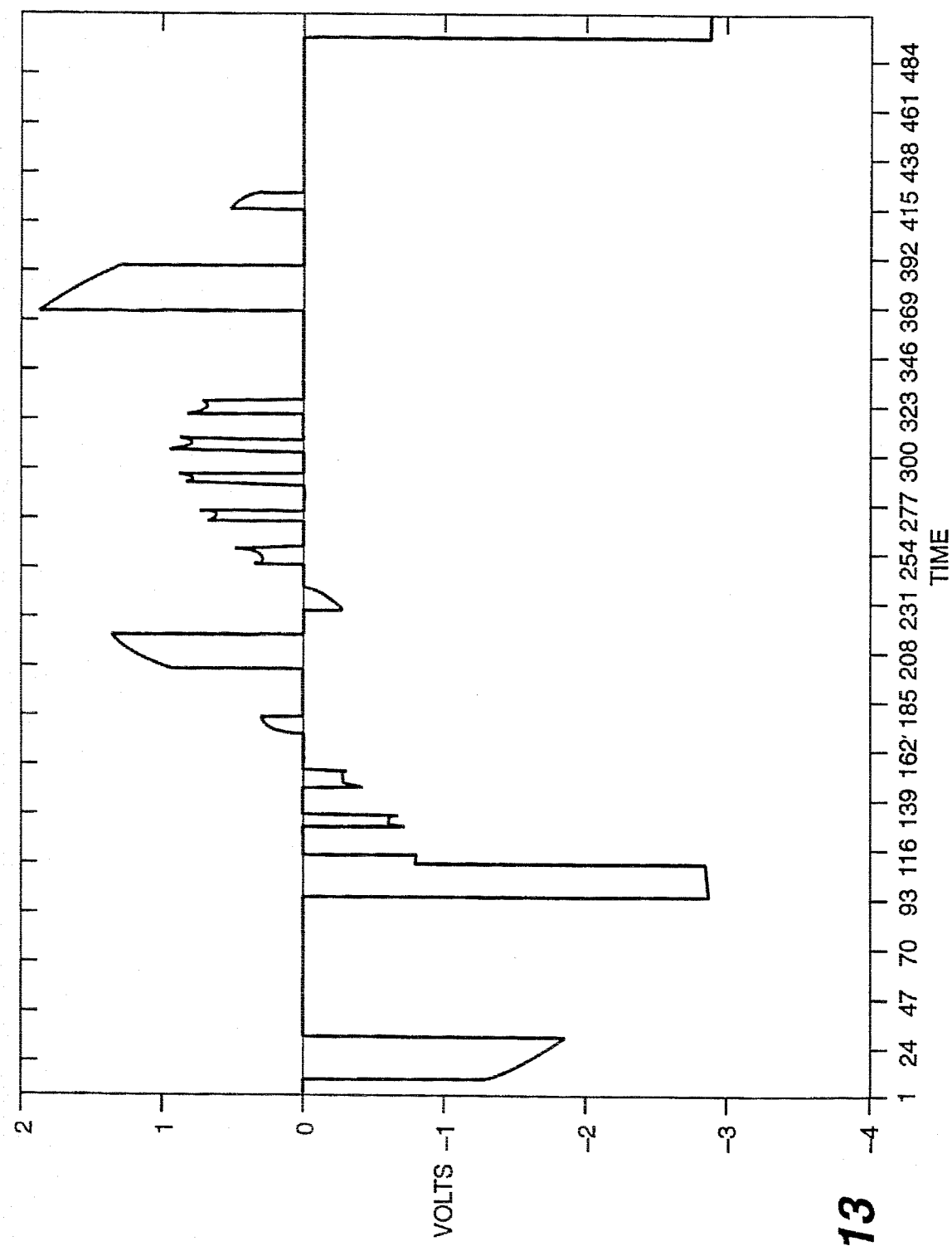
FIG._13

METHOD AND APPARATUS FOR REMOVING THE EFFECTS OF CO-CHANNEL INTERFERENCE FROM THE MESSAGE ON A DOMINANT FREQUENCY MODULATED CARRIER AND FOR RECOVERING THE MESSAGE FROM EACH OF TWO CO-CHANNEL CARRIERS

GOVERNMENT RIGHTS

This invention was made with Government support under Prime Contract Number N41756-94-5300 awarded by the United States Navy. The United States Government has certain rights to this invention.

TECHNICAL FIELD

The present invention generally relates to the removal of interference in electrical circuits, and, more particularly, to using amplitude and frequency information to provide an improved estimate of a message of interest or recover messages from each of two modulated sinusoids.

BACKGROUND OF THE INVENTION

Sinusoids are a natural form of propagation of acoustical and electromagnetic energy. Every sinusoid has an amplitude and an argument, or angle. If the amplitude or the argument of a sinusoid varies with time, then the sinusoid describes motion. If the motion involves propagation, then the sinusoid is called a wave. When the argument varies with time, then descriptions of frequency and phase are commonly used to express the nature and parameters of the motion.

Typically, waves have one or more of its three characteristic values changing with time. Such waves are said to be modulated.

The additive combination of two or more sinusoidal waves results in a single wave which is still sinusoidal. If the frequency of any one of the constituent waves differ from that of any other, then both the amplitude and the frequency of the resultant wave are modulated. Often, the modulation is perceived as a 'beat'.

In this description of sinusoidal waves, frequency is defined as the time rate of change of phase. A distinction is needed because there are circuits for measuring frequency and other circuits for measuring phase.

Waves are intentionally modulated to carry message information. In AM radio, the amplitude of a wave is varied in accordance with a message. Messages which are data bit streams are carried by varying the amplitude, frequency, phase, or combinations thereof, of the wave.

Traditionally, regulations and system designs for communication systems prevent any one modulated wave from interfering with any other wave. Techniques for avoiding interference include frequency assignments, geographical placement of transmitters, control of power levels, filtering, etc. The objective of these techniques is to provide a single, usable modulated wave in a defined band of frequencies at any time in a prescribed spatial region. This is done because interfering waves, or carriers, create additional modulation which distorts the message which is recovered by conventional demodulator circuitry.

Despite these efforts, co-channel interference does occur in communication systems. And in some frequency bands, regulations permit many users to simultaneously occupy the same channels so that operation on those channels is then limited by such interference.

One approach to reducing the effects of interference is the use of frequency filters, which are typically electrical or electromechanical. However, filtering can only significantly diminish those frequency components of an interfering signal which is outside a passband of a signal or signals of interest. Moreover, filters often distort the signal of interest within the passband itself. Nonetheless, frequency filtering remains an accepted practice for reducing the effects of noise and other interference.

Another approach to reducing the effects of interference is signal averaging. In averaging, several sample values or records of a voltage signal are obtained. These several signal measurements are then averaged. Unfortunately, the benefits of signal averaging cannot be realized in real time. Moreover, signal at engaging provides only an average value of a signal of interest, which may not be sufficiently accurate to correspond to the actual signal of interest. Lastly, if the mean value of the interference is not zero, and is unknown, then the resolved signal, which is the average value of the signal of interest, is biased by the non-zero mean value of the interference.

Another approach to reducing the effects of interference is to use signal correlation techniques. Correlation is also an averaging process. Consequently, the degree of interference reduction depends on the averaging time allowed for the application. Cancellation of interference in real time is not possible using correlation because correlation requires a priori knowledge of the signal to be effective. Correlation techniques are primarily used in signal detection applications, such as, for example, determining the presence or absence of a signal of a known structure.

Because of the limitations of present communication systems in the presence of interference and because of the limitations of filtering, averaging and correlation techniques for removing in real time the effects of interference on a message of interest, another technique for dealing with interference is desirable.

The inventor of the present invention has U.S. Pat. Nos. 4,859,958 ("patent '958"), 4,992,747 (patent "747"), which are both incorporated by reference as though fully set forth herein. In these patents, a means of demodulation of all of several FM carriers is described. U.S. Pat. No. 5,038,115 ("patent '115"), co-invented by the inventor of the present invention, is also incorporated by reference as though fully set forth herein. In patent '115, phase tracking of input terminal signals is described. In one embodiment of the phase tracking circuit of patent '115, a phase tracking circuit makes use of two phase-locked loops electrically connected in a feed-forward manner. U.S. patent application Ser. No. 08/214,378 by the inventor of the present invention is also reincorporated by reference as though fully set forth herein. The patent application describes, analytically and geographically, the effect of adding two sinusoids of different frequency.

Prior art which references use of the amplitude and frequency information to remove the effects of interference include the following: A theoretical work by M. A. Bykhovshiy entitled "A Comparison of the Effectiveness of FM Radio Interference Cancellers", Scripta Publishing Co. (Washington, D.C.) ISSN0040–2508/84/0003–130041, 1984, pp. 41–45, considers use of an amplitude detector with a frequency demodulator to remove the effects of very weak interference on a dominant frequency modulated carrier. Theoretical work by Yeheskel Bar-Ness entitled "Adaptive Co-Channel Interference Cancellation and Signal Separation Method", 1989 IEEE Conference Proceedings Ch2655–9/89/0000–0825, considers adaptive means to estimate the amplitudes of the desired and weaker interfering signal. The amplitude information is then used to remove the effect of the interference prior to demodulation. Archibald M. Pettigrew in U.S. Pat. No. 5,341,106 entitled "Amplitude Locked Loop Circuits", granted 23 Aug. 1994, on page 5 describes use of an amplitude-locked loop used in conjunction with a phase-locked loop to decode a frequency modulated signal.

None of the known prior art considers sampling by means of a switch or by means of digital signal processing in conjunction with an envelope detector and a frequency demodulator to remove the effects of interference on a recovered message of interest. The present invention provides novel, simple, robust systems when compared with those prior art systems described herein above.

SUMMARY OF THE INVENTION

The present invention relates to a method and apparatus for improving an estimate of a message being carried by a frequency modulated carrier in the presence of co-channel interference. Embodiments of the present invention permit recovery of the message from each of two co-channel modulated carriers. The messages can be analog or digital in nature and the carriers can be narrow band.

In accordance with the embodiments of the present invention, the output of any type of envelope detector controls the action of an electronic switch which is connected in series with the output terminal of any type of frequency demodulator. The interference creates voltage spikes superimposed on the message of interest at the output terminal of the frequency demodulator. The duration of these spikes is related to specific intervals of the envelope of a composite wave which consists of a dominant carrier and interfering carriers. Opening the aforementioned switch during the occurrence of these spikes prevents their passage to the output of the system. Sampling the output of the frequency demodulator output signal just prior to the switch opening and holding this sampled value while the switch is open maintains an estimate of the message of interest at the output of the system. The envelope level is used to control the switch action. In this manner, the present invention provides for removal of the effect of interference from a message of interest.

An alternate embodiment of the method and apparatus circuit which mitigates the effect of co-channel interference utilizes digital signal processing (DSP) circuitry to determine and control the instants of sampling the output of the frequency demodulator.

The output signal of a switch-and-hold circuit when subtracted from the frequency modulator output signal results in isolated spikes from which any message on a subdominant carrier can be recovered in addition to any message on a dominant carrier. The outputs resulting from use of DSP are sample values of the messages from which the continuous messages can be recovered by lowpass filtering.

The interference can be an independent frequency modulated carrier or an unmodulated carrier. The interference could also consist of multipath signals. In principle, use of the amplitude and frequency variations in concert can remove the effects of interference from a number of frequency modulated carriers.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a plot of envelope E and message coefficients D and S variation with phase.

FIG. 2 is a plot of message coefficient variations D and S with E.

FIG. 3 shows plots of waveforms for a message $m_d(t)$ carried by a dominant carrier and for a message $m_s(t)$ carried by a subdominant carrier.

FIG. 4 shows a waveform for an output signal F of any type of frequency demodulator in a system according to the invention.

FIG. 5 shows a waveform for an output signal E of any type of envelope detector in a system according to the invention.

FIG. 6 is a block diagram of the elements of a system for amplitude detection and frequency demodulating a composite input terminal signal.

FIG. 7 is a block diagram of a switch and hold circuit used to remove the voltage spikes from an output signal of a frequency demodulator.

FIG. 10 is an example of the isolated beat spikes obtained by subtracting the sample and interpolated values of a dominant carrier from the output signal F of a frequency demodulator.

FIG. 11 is a block diagram of a system used to recover messages from both dominant and subdominant carriers.

FIG. 12 is an example of samples of a message on a dominant carrier.

FIG. 13 is an example of the samples of an additive combination of the messages on two carriers.

FIG. 14 is a block diagram of a system according to the invention which uses two samplers.

DETAILED DESCRIPTION OF THE PREFERRED EMBODIMENTS

Figure 8:
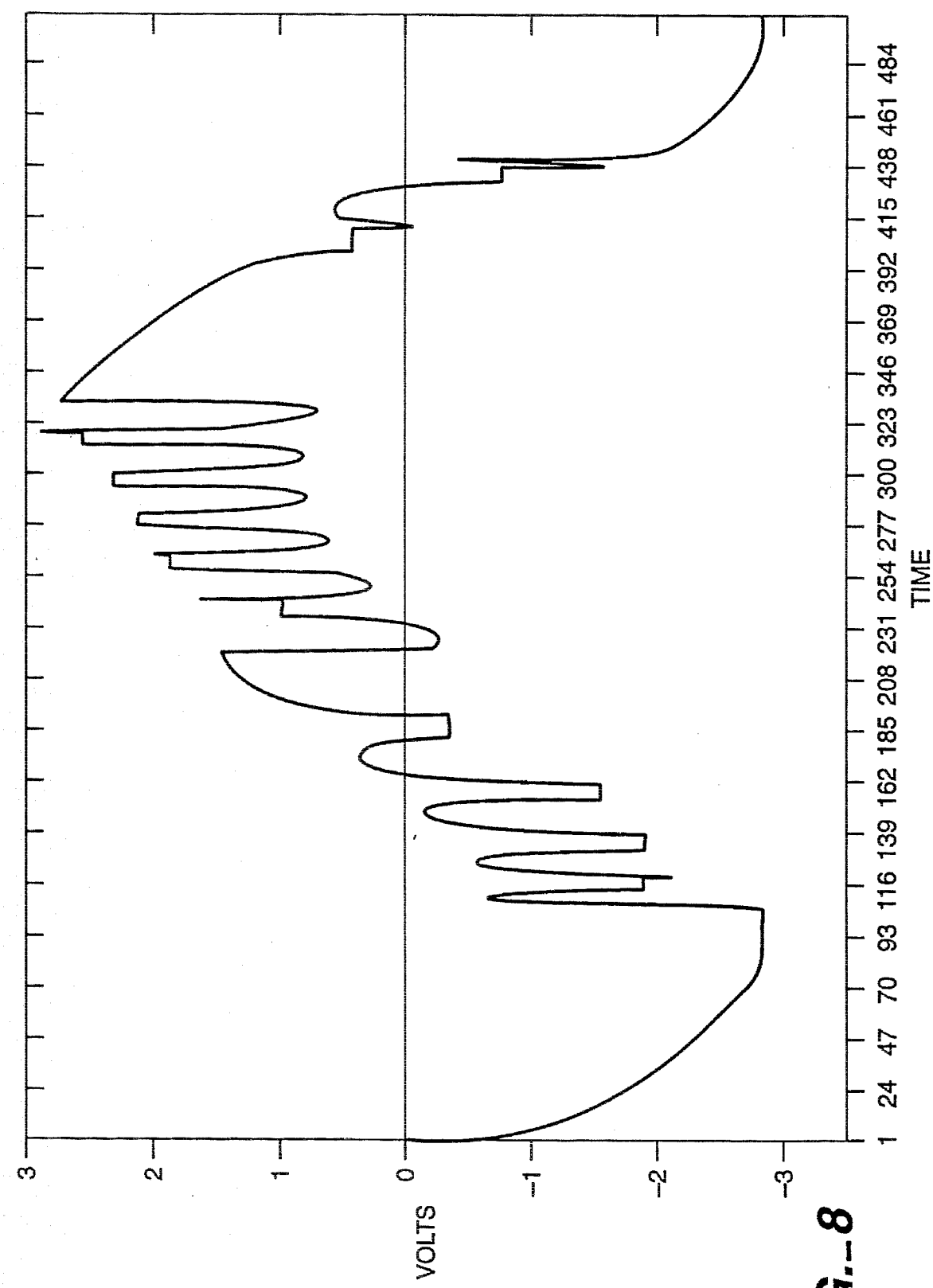
FIG. 8 is an example of sampled and held values of a message on a dominant carrier.

In "application '378", the inventor of the present invention describes analytically and graphically the effect of adding two sinusoids of different frequency. The additive combination is another sinusoid having amplitude and frequency which change with time. There, the form of the envelope E(t) and the instantaneous frequency F(t) of this sinusoid (the sum) is derived. The exact relationships are as follows:

$$E(t)=E=A_d.[1+r^2+2r \cos \phi(t)]^{1/2} \qquad (1)$$

$$F(t)=F=D.m_d(t)+S.m_s(t) \qquad (2)$$

Where $r=A_s/A_d$;

$A_S$=amplitude of the subdominant (weaker) carrier;

$A_d$=amplitude of the dominant (stronger) carrier;

$\phi_d(t)=\theta_d(t)-\theta_s(t)$;

$\theta_d(t)$=phase variation of the dominant carrier due to its message; and $\theta_s(t)$=phase variation of the subdominant carrier due to its message;

$$D=[1+r. \cos \phi(t)]/E^2(t) \qquad (3)$$

$$S=\{r[r+\cos\phi(t)]\}/E^2(t) \quad (4)$$

where $m_d(t)$=the message on the dominant carrier=$(\frac{1}{2}\pi)[d\theta(t)/dt]$ for FM carriers, and where $m_s(t)$=the message on the subdominant carrier=$(\frac{1}{2}\pi)[d\theta_s(t)/dt]$.

Expressing $\phi(t)$ in terms of E(t) gives $$D=1/(2A_d^2)+R/(2E^2) \quad (5)$$

$$S=1/(2A_d^2)-R/(2E^2) \quad (6)$$

$$R=1-r^2 \quad (7)$$

FIG. 1 is an example of the variation of E, D and S with phase $\phi$. Carrier separation is 3 dB. Shown are the variations of D and S in the equation $F=D.m_d(t)+S.m_s(t)$ where $m_d(t)$ and $m_s(t)$ are the messages on the dominant and subdominant carriers and F is the output of any frequency demodulator. Note $m_s(t)$ goes to zero when the phase is 135 and 225 degrees (forty units is 360 degrees).

FIG. 2 shows the dependency of D and S on E. Carrier separation is 3 dB. Shown are the variations of D and S vs envelope E. Note that S is zero when E is square root of R and R is $1-r^2$ with r the ratio of carrier amplitudes.

In the following, as a matter of convenience and without loss of generality, the peak amplitude of the dominant carrier is taken as unity. That is, $A_d=1$. Presented here as an example is the case of a stronger dominant carrier having more power and modulated with a sinusoidal message which is combined with, or added to, a weaker subdominant carrier modulated with a two-level voltage bit stream. These messages are shown as FIG. 3. In the absence of the weaker interference, the sinusoidal waveform of FIG. 3 would appear at the output terminal of a receiver with a frequency demodulator. Examples of frequency demodulators include the Philips NE605 quadrature demodulator and the Motorola 74HC4046AN phase locked loop.

When the weaker interfering carrier is present, the output F(t) of a frequency demodulator is shown in FIG. 4 with a 3 dB carrier separation. The message of interest plus a 'frequency beat' component appears at the output of any type of frequency demodulator. Removal of the 'frequency beat' component restores the message of interest. As seen in FIG. 4, the distortion represented by the 'frequency beat' voltage consists of large voltage excursions, herein referred to as 'spikes', whose peak value depends on the power separation of the two carriers as well as the frequency separation of the two carriers. Since the dominant carrier is frequency modulated, the frequency separation of the two carriers varies with time and so the peak value of the spikes varies accordingly as shown in FIG. 4.

FIG. 5 shows the peak amplitude variation E(t) of the sum of the two carriers. Such a voltage variation is provided as the output of any type of envelope detector. An example of an appropriate envelope detector is a full-wave rectifier which is realized by using the output of a hard limiter such as the Philips NE604 applied to one input terminal of a voltage multiplier such as the Analog Devices AD734. The other input to the other input terminal of the voltage multiplier is the output of a receiver intermediate frequency amplifier. Appropriate filtering of the full-wave rectified voltage appearing at the output terminal of the voltage multiplier completes the envelope detection operation.

FIG. 6 is a block diagram which shows the elements of a system 100 for providing an envelope signal E(t), or E and a frequency demodulated signal F(t), or F. The system a 100 includes an input terminal 102 of an intermediate frequency (IF) amplifier 104 which receives an IF signal from, for example, the RF receiver and down converter of a superheterodyne radio receiver. An output terminal 106 of the IF amplifier 104 is connected to an input terminal 108 of an envelope detector 110. The envelope detector 110 has an output terminal 112 at which is provided the signal E(t), or E. The output terminal 106 of the IF amplifier 104 is also connected to an input terminal 114 of a frequency demodulator 116. The frequency demodulator 116 has an output terminal 118 at which is provided the signal F(t), or F.

Sampling Circuit Embodiments

1. Electronic Switch Circuit

FIG. 7 is a block diagram of a system 130 according to the invention. The system includes a compacator 132 having an input terminal 134 for receiving an envelope signal E from terminal 112 of FIG. 6. Another input terminal 136 of the comparator 132 receives a threshold voltage $V_T$. An output terminal 138 of the comparator 132 is connected to a control terminal 140 of a switch 142. The switch 142 has an input terminal 144 for receiving a frequency signal F from terminal 118 of FIG. 6. An output terminal 146 of the switch 142 is applied to an input terminal 148 of a hold block 150. The hold block 150 has an output terminal 152 at which is provided a signal H1. The output terminal 152 is connected to an input terminal 154 of a lowpass filter156. An output terminal 158 of the lowpass filter 156 is connected through a capacitor C1 to an output terminal 160, at which is provided a signal D1.

The output terminal 152 of the hold circuit 150 is connected to an input terminal 162 of an interpolation block 164 which has an output terminal 166 at which is provided a signal H2. The output terminal 166 of the interpolation block 164 is connected to an input terminal 168 of another lowpass filter 170. An output terminal 172 of the lowpass filter 170 is connected through a capacitor C2 to an output terminal 174, at which is provided a signal D2.

The minimum value of E(t) is caused by destructive interference of the two carriers and the maximum value by constructive interference. The maximum value of the spike component of F(t) occurs at the minimum value of E(t). Between consecutive spikes of F(t), there are two instants of time when the 'frequency beat' component is zero. At these times, $F(t)=m_d(t)/A_d^2$, the message on the dominant carrier, and $m_s(t)=0$. From equation (2) at these times, $D=1/A_d^2$ and $S=0$. From equations (5), (6), and (7), at these times, $E=A_d \cdot \sqrt{R}$ when $A_d=1$. See FIGS. 1 and 2. So, these times correspond to particular values of E(t).

The comparator has provided these values of $E=A_d \cdot \sqrt{R}$ as the comparator reference or threshold level denoted VT in FIG. 7. An Elantec 2625 operational amplifier is configured as a comparator 132. The output of the comparator 132 controls the switch 142 which opens during the spike portion of the 'frequency beat' component of F(t). A CD4066 is an example of such a switch. In this manner, the spikes are excised from F(t).

To prevent the output from going to zero or some arbitrary value while the switch is open, a hold circuit 150 which holds the voltage while the switch 142 is open is used. A capacitor at the input terminal to an operational amplifier such as the LF356 when configured as a voltage follower provides a hold function. With proper setting of the comparator reference, this held voltage is a sample of the message of interest with no interference.

The result for the example considered is shown as FIG. 8. Coupling capacitors C1 and C2 in FIG. 7 block DC voltages. Shown is the result of holding values of F(t) while E(t) is less than $A_d \cdot \sqrt{R}$. Carrier separation is 3 dB.

A lowpass filter 156 is used to smooth the effect of switch action in the same manner that lowpass filtering recovers any message from its appropriate sample values as prescribed by the sampling theorem. An 8th order active Butterworth lowpass filter can be realized using a TL084 quad operational amplifier.

The estimate of the true message of interest when recovered in this manner can be improved by interpolating between the values of F(t) just prior to the switch opening and just following the switch closing rather than holding the value just prior to switch opening.

Figure 9:
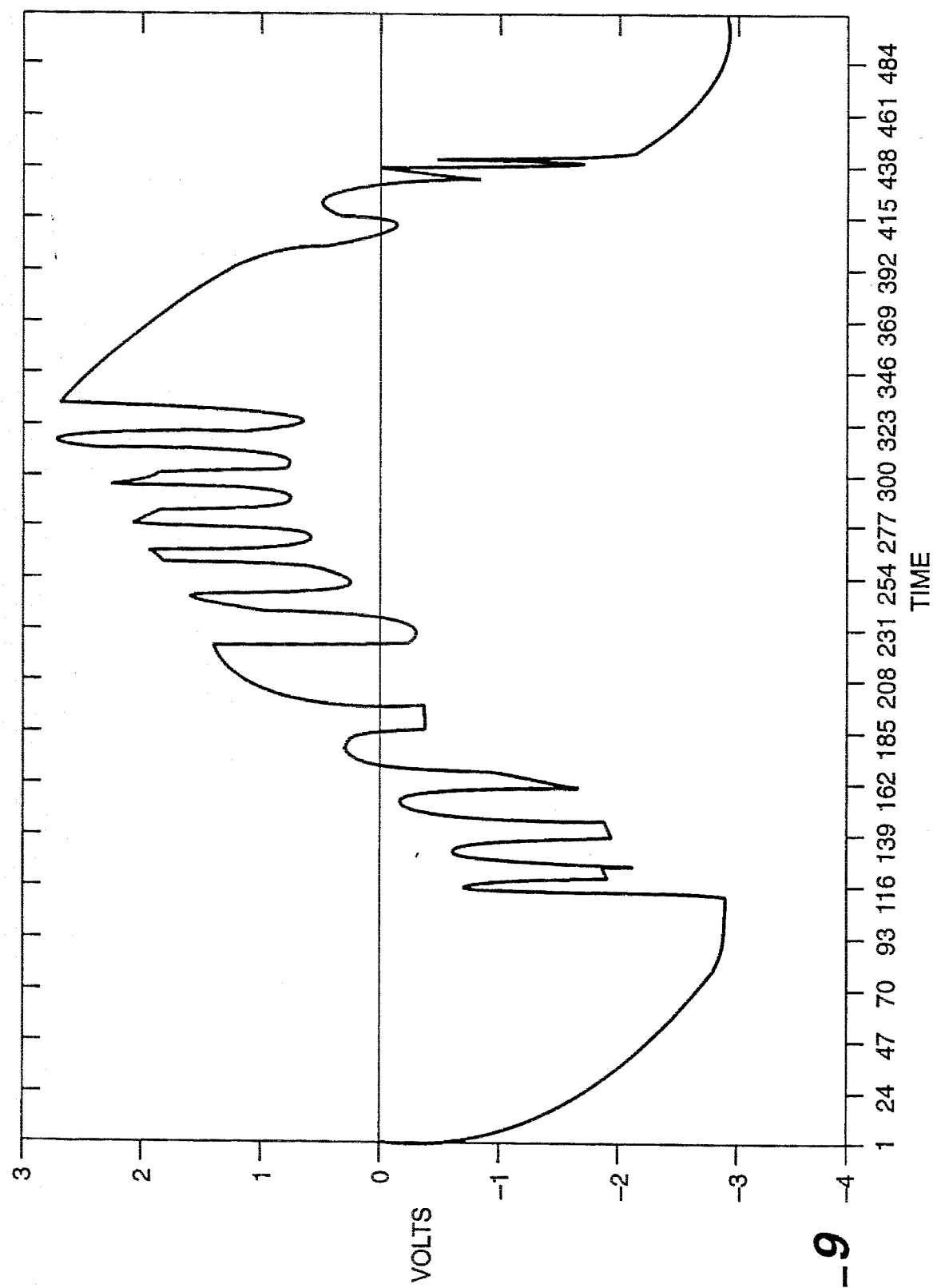
FIG. 9 is an example of the sampled and interpolated values of a message on a dominant carrier.

FIG. 9 shows the result of such interpolation. Shown is the result of applying linear interpolation between the values of F(t) immediately preceding and immediately following the held value. Carrier separation is 3 dB. Although difficult to accomplish with analog circuitry, such interpolation is readily done using digital signal processing techniques and circuitry.

A continuous estimate $\hat{m}_d(t)$ of the message on the dominant carrier is obtained by lowpass filtering the sampled and held or sampled and interpolated values. So, $\hat{m}_d(t)$ appears as D1 at output terminal 160 and an interpolated value $\hat{m}_d(t)$ appears as D2 at output terminal 174 in FIG. 7.

A means of obtaining an estimate $\hat{m}_s(t)$ of the message on the subdominant carrier is to use the fact that the peak value of the spikes in FIG. 3 are a measure of $k_d m_d(t) - k_s m_s(t)$ where $k_d$ and $k_s$ are constants depending on the peak frequency deviations of the carriers. This is so because the peak value of these spikes depends on the difference in instantaneous frequency of the two carriers and that difference is determined by the message voltages for the case of FM carriers. So, subtracting this measure from an appropriately scaled version of the voltage at nodes D1 or D2 in FIG. 7 gives $\hat{m}_s(t)$.

To isolate the beat spikes, subtract $\hat{m}(t)$ from F(t). The result is shown as FIG. 10. Shown are isolated beat spikes obtained by subtracting the estimate of the message on the dominant carrier from F(t). The peak values of these spikes represent sample values of an additive combination of the two messages. Carrier separation is 3 dB. The isolated beat spikes now represent sample values of $k_d m_d(t) - k_s m_s(t)$. Lowpass filtering provides the continuous version.

FIG. 11 shows a block diagram of a system 180 used to recover both a message on a dominant carrier and a message on a subdominant carrier separately without crosstalk on either. Voltage H1 or H2 is subtracted from F using voltage summer 184 to isolate the beat spikes at node X. Voltage H1 or H2 (vice D1 or D2) is used to avoid phase shift resulting from lowpass filtering. A subtractor can be formed using an operational amplifier such as the LF 351 as an inverter and another as a summer. The second voltage summer 194 of FIG. 11 removes that portion of the dominant message present in the voltage at node X by subtracting an appropriate amount of H1 or H2. The result is an estimate $\hat{m}_s(t)$ of the message on the subdominant carrier as shown in FIG. 11. Any portion of ms(t) that remains in D1 or D2 can now be removed with voltage summer 3 (subtractor) to provide an estimate $\hat{m}_d(t)$ as shown in FIG. 11. A result is two outputs with no crosstalk on either. Potentiometers when used alone or in conjunction with amplifiers can decrease or increase the amount (level) of any applied voltage. Such level control is provided by potentiometers P1, P2, and P3 in FIG. 11.

In particular, with regard to system 180 of FIG. 11, the frequency demodulated signal F is applied to an input terminal 182 of a first voltage summer 184. Another input terminal 186 of the first voltage summer 184 has an unfiltered H1 or H2 signal from a terminal 188 applied to it through a potentiometer P1. An output terminal 190 of the first voltage summer 184 is connected to an input terminal 192 of a second voltage summer 194. Another input terminal 196 of the second voltage summer 194 is connected through a potentiometer P2 to the input terminal 188. An output terminal ][98 of the second voltage summer 194 is connected to an input terminal 200 of a lowpass filter 202. An output terminal 204 of the lowpass filter is connected to an output terminal 206 to provide an estimate of the message on the subdominant carrier. The output terminal 204 of the lowpass filter is also connected through a potentiometer P3 to an input terminal 208 of a third voltage summer 210. Another input terminal 212 of the third voltage summer 210 has signals D1 or D2 applied to it. An output terminal 214 of the third voltage summer 210 provides an estimate $\hat{m}_d(t)$ of the message on the dominant carrier.

The circuits of FIGS. 6, 7 and 11 have been realized in breadboard form for laboratory testing and in printed circuit board form for a particular application. Operation of the circuits is as described herein above.

2. Digital Signal Processor

Digital signal processing (DSP) circuitry is well suited to recover estimates of the messages on both carriers by using the outputs of any type of envelope detector and any type of frequency demodulator.

From equations (5), (6) and (7), $F(t) = m_d(t)/A_d^2$ when $E = A_d \sqrt{R} = A_d (1-r^2)^{1/2}$. Therefore, sampling F when E is in the neighborhood of $A_d \sqrt{R}$ provides samples of $m_d(t)/A_d^2$. An example is shown as FIG. 12. Lowpass filtering recovers the continuous version. Shown are samples of the message on the dominant carrier obtained by sampling F(t) when E(t) is in the neighborhood of $A_d \sqrt{R}$ volts. The continuous message is obtained from these sample values by lowpass filtering. Carrier separation is 3 dB.

From equations (5), (6) and (7), coefficients D and S vary with envelope E in a predictable manner as shown in FIG. 2. Therefore, for any value of E, F at the time that value of E occurs is a particular linear combination of the two messages. Examples of such combinations are shown in Table I.

TABLE I

| $E/A_d$ | $F \cdot A_d^2$ |
| --- | --- |
| $1 + r$ | $(m_d + rm_s)/(1 + r)$ |
| $(1 + r2)^{1/2}$ | $(m_d + r^2 m_s)/(1 + r^2)$ |
| $(1 - r^2)^{1/2}$ | $m_d$ |
| $1 - r$ | $(m_d - rm_s)/(1 - r)$ |

FIG. 13 is an example of samples of F(t) taken when E is in the neighborhood of (1+r) volts (peak value of E(t)) for the case $A_d=1$. Shown are samples of an additive combination of the messages on the two carriers obtained by sampling F(t) when E(t) is in the neighborhood of its maximum value. Carrier separation is 3 dB. Specifically, FIG. 13 is a plot of F when $E>(1+r^2)$. Selecting samples of F when $E> \sqrt{R}$ avoids beat spikes. This is advantageous when using DSP because large values of clock frequency are required to faithfully record peak values of fleeting voltages such as the short duration spikes shown in FIG. 4. These spikes only occur when $E < \sqrt{R}$.

FIG. 14 shows a system 230 for obtaining estimates of $m_d(t)$ and $m_s(t)$. Sampling F when $E=E1=(1-r^2)^{1/2}$ provides a continuous estimate of $m_d(t)$ after lowpass filtering (one). Sampling F when E equals E2 (and not E1) provides a known continuous estimate of $c_d m_d(t) + c_s m_s(t)$, where $c_d$ and $c_s$ are known constants, after lowpass filtering (two).

In particular, with regard to system 230 of FIG. 14, the frequency demodulated signal F(t) is applied to an input terminal 232 of a first sampler 234 and to an input terminal 256 of a second sampler 258. An envelope signal E(t) is applied to an input terminal 240 which is connected to respective input terminals of an E1 detector 244 and of an E2 detector 266. These detectors provide control signals to their respective samplers 234, 258 when E(t) has a voltage level of E1 or E2.

An output terminal 236 of the first sampler 234 is connected to an input terminal 248 of a first lowpass filter 250. The output terminal 252 of the first lowpass filter 250 is connected to an output terminal 252 which provides an estimate m̂d(t) of the message on the dominant carrier at terminal 254.

An output terminal 260 of the second sampler 258 is connected to an input terminal 270 of a second lowpass filter 272. An output terminal 274 of the second lowpass filter 272 is connected to an input terminal 276 of a level controller 278. An output terminal 280 of the level controller 278 is connected to one input terminal 282 of a voltage summer 284. Another input terminal 286 of the voltage summer is connected to the output terminal 252 of the first lowpass filter 250. An output terminal 288 of the voltage summer 286 is connected to an output terminal 288 at which is provided an estimate $-\hat{m}_s(t)$ of the message on the subdominant carrier.

DSP can also be used to determine r by examining a brief history of E and noting the maximum and minimum values of E(t).

Implementation of the features of the DSP presentation and FIG. 14 can be realized using conventional analog circuitry. For example, sampling F at particular values of E can be achieved using voltage window circuits, configured with operational amplifiers, and an electronic switch. The level controller can be a potentiometer used alone as an attenuator or in conjunction with an operational amplifier to increase the value of the input to the level controller.

While the present invention has been particularly shown and described with respect to certain preferred embodiments thereof, it should be readily apparent to those of ordinary skill in the art that various changes and modifications in form and detail may be made without departing from the spirit and scope of the invention as set forth in the appended claims. In particular, for example, this invention may be used for phase modulated as well as frequency modulated carriers. Also, circuitry and processing may be simplified when it is known one of the carriers is unmodulated or when other prior information exists. With DSP, sampling F, and F at regular intervals of time can be used in place of sampling at regular values of E. The invention illustratively disclosed herein may be practiced in the absence of any element which is not specifically disclosed herein. The invention is not limited to the embodiments disclosed herein and may be practiced using other technique such as, for example, DSP or software implementations of circuit or system functions.

I claim:

1. A system for providing an estimate of a message being carried by a frequency modulated dominant carrier in the presence of co-channel interference from a subdominant carrier, said system comprising:

an intermediate frequency (IF) amplifier (104) which has an input terminal (102) for receiving an IF input terminal signal, said IF amplifier having an output terminal (106);

an envelope detector (110) which has an input terminal (108) connected to the output terminal (106) of the IF amplifier (104), said envelope detector (110) having an output terminal (112) at which is provided an envelope signal E(t);

a frequency demodulator (116) having an input terminal (114) to which is connected the output terminal (106) of the IF amplifier (104), said frequency demodulator (116) having an output terminal (118) at which is provided a frequency demodulated signal F(t);

a comparator (132) having an input terminal (134) for receiving an envelope signal E from the output terminal (112) of the envelope detector (110), said comparator having another input terminal (136) for receiving a threshold voltage $V_T$, said comparator having an output terminal (138);

a switch (142) having a control terminal (140) connected to the output terminal (138) of the comparator (132), the switch (142) having an input terminal (144) to which is connected the output terminal (118) of the frequency demodulator (116), said switch having an output terminal (146) at which is provided the frequency demodulated signal F(t) when said switch is closed; and a hold circuit (150) having an input terminal (148) to which the output terminal (146) of the switch (142) is connected, said hold circuit (150) having an output terminal (152) at which is provided a signal H1.

2. The system of claim 1, further including:

a lowpass filter (156) having an input terminal (154) connected to the output terminal (152) of the hold circuit (150), the lowpass filter (156) having an output terminal (158) which is connected through a capacitor C1 to an output terminal (160), at which is provided a signal D1 which is an estimate of the message on the dominant carrier present at the input terminal (102) of the IF amplifier (104).

3. The system of claim 1, further including:

an interpolation circuit (164) which has an input terminal (162) connected to the output terminal (152) of the hold circuit (150), said interpolation circuit (164) having an output terminal (166) at which is provided a signal H2.

4. The system of claim 1, further including:

a lowpass filter (170) having an input terminal (168) connected to the output terminal (166) of the interpolation circuit and which has an output terminal (172) connected through a capacitor C2 to an output terminal (174), at which is provided a signal D2 which is an improved estimate of the message on a dominant carrier present at the input terminal (102) of the IF amplifier (104).

5. A system for recovering estimates of the messages being carried by a frequency modulated dominant carrier and by a co-channel frequency modulated subdominant carrier, said system comprising:

an intermediate frequency (IF) amplifier (104) which has an input terminal (102) for receiving an IF input terminal signal, said IF amplifier having an output terminal (106);

an envelope detector (110) which has an input terminal (108) connected to the output terminal (106) of the IF amplifier (104), said envelope detector (110) having an output terminal (112) at which is provided an envelope signal E(t);

a frequency demodulator (116) having an input terminal (114) to which is connected the output terminal (106) of the IF amplifier (104), said frequency demodulator (116) having an output terminal (118) at which is provided a frequency demodulated signal F(t);

a comparator (132) having an input terminal (134) for receiving an envelope signal E from the output terminal (112) of the envelope detector (110), said comparator having another input terminal (136) for receiving a threshold voltage $V_T$, said comparator having an output terminal (138);

a switch (142) having a control terminal (140) connected to the output terminal (138) of the comparator (132), the switch (142) having an input terminal (144) to which is connected the output terminal (118) of the frequency demodulator (116), said switch having an output terminal (146) at which is provided the frequency demodulated signal F(t) when said switch is closed; and a hold circuit (150) having an input terminal (148) to which the output terminal (146) of the switch (142) is connected, said hold circuit (150) having an output terminal (152) at which is provided a signal H1.

6. The system of claim 5, further including:

a lowpass filter (156) having an input terminal (154) connected to the output terminal (152) of the hold circuit (150), the lowpass filter (156) having an output terminal (158) which is connected through a capacitor C1 to an output terminal (160), at which is provided a signal D1 which is an estimate of the message on the dominant carrier present at the input terminal (102) of the IF amplifier (104).

7. The system of claim 5, including:

an interpolation circuit (164) which has an input terminal (162) connected to the output terminal (152) of the hold circuit (150), said interpolation circuit (164) having an output terminal (166) at which is provided a signal H2.

8. The system of claim 5, further including:

a lowpass filter (170) having an input terminal (168) connected to the output terminal (166) of the interpolation circuit and which has an output terminal (172) connected through a capacitor C2 to an output terminal (174), at which is provided a signal D2 which is an improved estimate of the message on a dominant carrier present at the input terminal (102) of the IF amplifier (104).

9. The system of claim 5, further including:

a first voltage summer (184) having a first input terminal (182) to which the frequency demodulated signal F at terminal (118) of frequency demodulator (116) is applied, said first voltage summer (184) having a second input terminal (186) to which either an unfiltered signal H1 at terminal (152) of hold circuit (150) or an unfiltered signal H2 at terminal (166) of interpolation circuit (164) is applied through a potentiometer P1, said first voltage summer (184) having an output terminal (190) at which is provided the sum of the voltages at input terminals (182) and (186) of said first voltage summer (184); and a second voltage summer (194) having a first input terminal (192) connected to the output terminal (190) of the first voltage summer (184), said second voltage summer (194) having another input terminal (196) to which either an unfiltered signal H1 from output terminal (152) of hold circuit (150) or an unfiltered signal H2 from output terminal (166) of interpolation circuit (164) is applied through a potentiometer P2, said second voltage summer (194) having an output terminal (198) at which is provided the sum of the voltages at input terminals (192) and (196) of said second voltage summer (194).

10. The system of claim 5, further including:

a lowpass filter (202) having an input terminal (200) connected to the output terminal (198) of the second voltage summer (194), said lowpass filter (202) having an output terminal (204) at which is provided an estimate of the message on the subdominant carrier present at the input terminal (102) of the IF amplified (104).

11. The system of claim 5, further including:

a third voltage summer (210) having a first input terminal (208) connected through a potentiometer P3 to the output terminal (204) of lowpass filter (202), said third voltage summer (210) having another input terminal (212) to which either a signal D1 is applied from terminal (160) connected through capacitor C1 to output terminal (158) of lowpass filter (156) or a signal D2 is applied from terminal (174) connected through capacitor C2 to output terminal (172) of lowpass filter (170), said third voltage summer (210) having an output terminal (214) at which is provided an estimate of the message on the dominant carrier present at the input terminal (102) of the IF amplifier (104), said estimate now free of crosstalk.

12. A system for providing an estimate of the message being carried by a frequency modulated dominant carrier in the presence of co-channel interference from a subdominant carrier, said system comprising:

an intermediate frequency (IF) amplifier (104) which has an input terminal (102) for receiving an IF input terminal signal, said IF amplifier having an output terminal (106);

an envelope detector (110) which has an input terminal (108) connected to the output terminal (106) of the IF amplifier (104), said envelope detector (110) having an output terminal (112) at which is provided an envelope signal E(t);

a frequency demodulator (116) having an input terminal (114) to which is connected the output terminal (106) of the IF amplifier (104), said frequency demodulator (116) having an output terminal (118) at which is provided a frequency demodulated signal F(t);

a first sampler (234) having an :input terminal (232) to which is connected the output terminal (118) of frequency demodulator (116), said first sampler (234) having a sample control input terminal (238) and an output terminal (236);

a first level detector (244) having an input terminal (242) to which is connected envelope signal E(t) at terminal (240) and an output terminal (246 ); and a first low pass filter (250) having an input terminal (248) connected to output terminal (236) of first sampler (234), said lowpass filter (250) having an output terminal (252) connected to terminal (254) at which is provided an estimate of the message on the dominant carrier present at the input terminal (102) of the IF amplifier (104).

13. A system for providing an estimate of the message being carried by a frequency modulated subdominant carrier in the presence of co-channel interference from a dominant carrier, said system comprising:

an intermediate frequency (IF) amplifier (104) which has an input terminal (102) for receiving an ]IF input terminal signal, said IF amplifier having an output terminal (106);

an envelope detector (110) which has an input terminal (108) connected to the output terminal (106) of the IF amplifier (104), said envelope detector (110) having an output terminal (112) at which is provided an envelope signal E(t);

a frequency demodulator (116) having an input terminal (114) to which is connected the output terminal (106) of the IF amplifier (104), said frequency demodulator (116) having an output terminal (118) at which is provided a frequency demodulated signal F(t);

a first sampler (234) having an input terminal to which is connected the output terminal (118) of frequency demodulator (116), said first sampler (234) having a sample control input terminal (238) and an output terminal (236);

a first level detector (246) having an input terminal (242) to which is connected envelope signal E(t) at terminal (240) and an output terminal (246);

a first lowpass filter (250) having an input terminal (248) connected to output terminal (236) of first sampler (234), said lowpass filter (250) having an output terminal (252) connected to terminal (254) at which is provided an estimate of the message on the dominant carrier present at input terminal (102) of the IF amplifier (104);

a second sampler (258) having an input terminal (256) to which is connected the output terminal (118) of frequency demodulator (116), said second sampler (258) having a sample control input terminal (262) and an output terminal (260);

a second level detector (266) having an input terminal (264) to which is connected envelope signal E(t) at terminal (240) and an output terminal (268);

a second lowpass filter (272) having an input terminal (270) connected to output terminal (260) of second sampler (258), said lowpass filter (272) having an output terminal (274);

a level controller (278) having an input terminal (276) connected to output terminal (274) of second lowpass filter (272), said level controller having an output terminal (280); and a voltage summer (284) having a first input terminal (282) connected to the output terminal (280) of tube level controller (278), said voltage summer (284) having another input terminal (286) connected to output terminal (252) of lowpass filter (250), said voltage summer (284) having an output terminal (288) at which is provided an estimate of the message on the subdominant carrier present at the input terminal (102) of the IF amplifier (104).

14. A method for providing an estimate of a message being carried by a frequency modulated dominant carrier in the presence of co-channel interference from a subdominant carrier, said method comprising the steps of:

receiving an input terminal signal from an intermediate frequency (IF) amplifier (104);

envelope detecting the IF input terminal signal to provide an envelope signal E(t);

frequency demodulating the IF signal to provide a demodulated frequency signal F(t);

comparing the envelope signal E(t) with a threshold voltage $V_T$ to provide a comparator output signal which controls the action of a switch;

switching the frequency demodulated signal F(t) to an output terminal to provide a sampled frequency demodulated signal F(t) using the envelope signal E(t) to control the switching; and holding the level of the switched frequency demodulated signal F(t) as a signal H1.

15. The method of claim 14, further including:

lowpass filtering the signal H1 to provide a filtered estimate of the message on the dominant carrier as signal D1.

16. The method of claim 14, further including:

interpolating the signal H1 to provide an interpolated signal H2.

17. The method of claim 14, further including:

lowpass filtering the signal H2 to provide a filtered, interpolated estimate of the message on the dominant carrier as the output signal D2.

18. A method for recovering estimates of the messages being carried by a frequency modulated dominant carrier and by a co-channel frequency modulated subdominant carrier, said method comprising the steps of: receiving an input terminal signal from an intermediate frequency (IF) amplifier (104);

envelope detecting the IF input terminal signal to provide an envelope signal E(t);

frequency demodulating the IF signal to provide a frequency demodulated signal F(t);

comparing the envelope signal E(t) with a threshold voltage $V_T$ to provide a comparator output signal which controls the action of a switch;

switching the demodulating frequency signal F(t) to an output terminal to provide a sampled frequency demodulated signal F(t) using the envelope signal E(t) to control the switching; and holding the level of the switched frequency demodulated signal F(t) as a signal H1.

19. The method of claim 18, further including:

lowpass filtering the signal H1 to provide a filtered estimate of the message on the dominant carrier as signal D1.

20. The method of claim 18, further including:

interpolating the signal H1 to provide an interpolated signal H2.

21. The method of claim 18, further including:

lowpass filtering the signal H2 to provide a filtered, interpolated estimate of the message on the dominant carrier as the output signal D2.

22. The method of claim 18, further including:

summing the frequency demodulated F(t) signal with either an unfiltered H1 or a H2 signal which is applied through a potentiometer P1 to provide a first summed signal; and summing the first summed signal with either an unfiltered H1 or a H2 signal through a potentiometer P2 to provide a second summed signal.

23. The method of claim 18, further including:

lowpass filtering a second summed signal to provide an estimate of the message on the subdominant carrier which is free of crosstalk.

24. The method of claim 18, further including:

summing the estimate of the message on the subdominant carrier with either a signal D1 or a signal D2 to provide an estimate of the message on the dominant carrier which is free of crosstalk.

25. A method for providing an estimate of a message being carried by a frequency modulated dominant carrier in the presence of co-channel interference from a subdominant carrier, said method comprising the steps of:

receiving an input terminal signal from an intermediate frequency (IF) amplifier (104);

envelope detecting the IF input terminal signal to provide an envelope signal E(t);

frequency demodulating the IF signal to provide a frequency demodulated signal F(t);

sampling the frequency demodulated signal F(t) when the envelope signal E(t) has a value in the neighborhood of E1 volts to provide a sampled version of the frequency demodulated signal F(t);

detecting when the envelope signal E(t) is in the neighborhood of E1 volts to provide instruction to the sampler; and lowpass filtering the sampled frequency demodulated signal F(t) to provide an estimate of the message on the dominant carrier.

26. A method for providing an estimate of the message being carried by a frequency modulated subdominant carrier in the presence of co-channel interference from a dominant carrier, said method comprising the steps of;

receiving an input terminal signal from an intermediate frequency (IF) amplifier (104);

envelope detecting the IF input terminal signal to provide an envelope signal E(t);

frequency demodulating the IF signal to provide a frequency demodulated signal F(t);

sampling the frequency demodulated signal F(t) when the envelope signal E(t) has a value in the neighborhood of E1 volts to provide a first sampled version of the frequency demodulated signal F(t);

detecting when the envelope signal E(t) is in the neighborhood of E1 volts to provide instruction to the first sampler;

lowpass filtering the first sampled frequency demodulated signal F(t) to provide an estimate of the message on the dominant carrier;

sampling the frequency demodulated signal F(t) when the envelope signal E(t) has a value in the neighborhood of E2 volts to provide a second sampled version of the frequency demodulated signal F(t);

detecting when the envelope signal E(t) is in the neighborhood of E2 volts to provide instruction to the second sampler;

lowpass filtering the second sampled frequency demodulated signal F(t) to provide an estimate of the sum of the message on the dominant carrier and of the message on the subdominant carrier;

controlling the level of the sum of the message on the dominant carrier and of the message on the subdominant carrier to provide an appropriate level of the dominant carrier; and summing the estimate of the message on the dominant carrier and an estimate of the sum of the level-adjusted message on the dominant carrier and the like level-adjusted message on the subdominant carrier to provide an estimate of the message on the subdominant carrier which is free of crosstalk.

* * * * *